(12) United States Patent
Mohammed

(10) Patent No.: US 7,994,644 B2
(45) Date of Patent: Aug. 9, 2011

(54) PACKAGE STACKING THROUGH ROTATION

(75) Inventor: Ilyas Mohammed, Santa Clara, CA (US)

(73) Assignee: Tessera, Inc., San Jose, CA (US)

( * ) Notice: Subject to any disclaimer, the term of this patent is extended or adjusted under 35 U.S.C. 154(b) by 406 days.

(21) Appl. No.: 12/148,297

(22) Filed: Apr. 16, 2008

(65) Prior Publication Data

US 2008/0296749 A1    Dec. 4, 2008

Related U.S. Application Data

(60) Provisional application No. 60/932,630, filed on Jun. 1, 2007.

(51) Int. Cl.
*H01L 23/48* (2006.01)
*H01L 23/52* (2006.01)
*H01L 29/40* (2006.01)

(52) U.S. Cl. ........................ 257/782; 257/784

(58) Field of Classification Search .................. 257/678, 257/782, 784

See application file for complete search history.

(56) References Cited

U.S. PATENT DOCUMENTS

2007/0126102 A1* 6/2007 Mohammed et al. ......... 257/686

* cited by examiner

*Primary Examiner* — Thien F Tran
(74) *Attorney, Agent, or Firm* — Lerner, David, Littenberg, Krumholz & Mentlik, LLP

(57) ABSTRACT

A packaged microelectronic element includes a package element that further includes a dielectric element having a bottom face and a top face, first and second bond windows extending between the top and bottom faces, a plurality of chip contacts disposed at the top face adjacent to the first and second bond windows, and first and second sets of package contacts exposed at diagonally opposite corner regions of the top face, wherein the first and second sets conductively connected to the chip contacts. There is also a microelectronic element adjacent to the bottom face of the dielectric element, as well as bond wires extending through the first and second bond windows to conductively connect the microelectronic element to the chip contacts.

12 Claims, 13 Drawing Sheets

PACKAGE STACKING THROUGH ROTATION

This application claims the benefit of the filing date of U.S. Provisional Patent Application No. 60/932,630 filed Jun. 1, 2007, the disclosure of which is hereby incorporated herein by reference.

BACKGROUND OF THE INVENTION

The present invention relates to microelectronic packages and more particularly to microelectronic packages such as semiconductor chip packages in which a plurality of semiconductor elements are stacked one on top of the other.

Semiconductor chips are commonly provided as individual, prepackaged units. In some unit designs, the semiconductor chip is mounted to a substrate or chip carrier, which is in turn mounted on a circuit panel, such as a printed circuit board. The circuit board usually has electrical conductors, normally referred to as traces extending in a horizontal direction parallel to the surface of the circuit board and terminals or other electrical conductive elements connected to the traces. The packaged chips are mounted so that the terminals disposed on each unit are electrically connected to contact pads or terminals of the circuit board. In this conventional arrangement, the theoretical minimum area of the circuit board must be at least equal to the aggregate areas of all the terminal-bearing surfaces of the individual prepackaged units. However, in practice, the circuit board must be somewhat larger than this. Thus, space issues often arise. Additionally, traces in these configurations must have significant length and impedance, so that appreciable time is required for propagation of signals along the traces and the speed of operation of the circuit is limited.

To alleviate these drawbacks, the "stacking" of units above one another in a common package is often employed. Essentially, in this type of design, the package itself has vertically extending conductors that are connected to the terminals of the circuit board. In turn, the individual chips within the package are connected to these vertically extending conductors. Because the thickness of a chip is substantially smaller than its horizontal dimensions, the internal conductors can be shorter than the traces on a circuit board that would be required to connect the same number of chips in a conventional arrangement. Examples of such stacked package designs are taught in U.S. Pat. Nos. 5,861,666; 5,198,888; 4,956,694; 6,072,233; and 6,268,649; and U.S. Patent Publication No. 2003/010711801; and pending patent application Ser. Nos. 11/291,398 filed Dec. 1, 2005, and 60/923,953 filed Apr. 16, 2007, the disclosures of which are hereby incorporated by reference herein. Oftentimes, the vertically extending conductors are in the form of solid balls or the like, which connect the prepackaged units to each other and to the circuit board.

Despite the considerable efforts in the art towards development of stacked packages, still further improvements would be desirable.

SUMMARY OF THE INVENTION

In a first embodiment of the present invention, there is a packaged microelectronic element having a package element that includes a dielectric element with a bottom face and a top face that is remote from the bottom face and first and second bond windows extending between the top and bottom faces. There is also a plurality of chip contacts disposed at the top face adjacent to the first and second bond windows and first and second sets of package contacts exposed at diagonally opposite corner regions of the top face. The first and second sets of package contacts may be conductively connected to the chip contacts. A microelectronic element is adjacent to the bottom face. Bond wires extend through the first and second bond windows to conductively connect the microelectronic element to the chip contacts. The bond wires may also be connected to bond pads of the microelectronic element.

In another aspect of this embodiment, there may also include first and second bond windows disposed adjacent to and extend in a direction parallel to the first and second opposite edges of the microelectronic element. The first and second bond windows may be aligned with the bond pads.

In yet another aspect of this embodiment, The microelectronic element may have long edges extending in a longitudinal direction and shorter edges extending in a lateral direction. The shorter edges may be shorter than the long edges and the corner regions may be adjacent to the long edges.

In still a further aspect of this embodiment, the microelectronic package may further comprise first and second sets of conductive traces extending from the chip contacts along the top face to the first and second sets of package contacts, respectively.

In another aspect of this embodiment, the chip contacts may include first chip contacts adjacent to a first edge of the microelectronic element and second chip contacts adjacent to a second edge of the microelectronic element opposite from the first edge. The first set of traces may extend from the first chip contacts to the first package contacts but not the second package contacts. Additionally, the second set of traces may extend from the second chip contacts to the second package contacts but not the first package contacts.

In yet another aspect of this embodiment, the package contacts include conductive posts extending from pads at the top face.

In a second embodiment of a stacked microelectronic assembly, there is a first packaged microelectronic element stacked and electrically interconnected with a second packaged microelectronic element. Each of the packaged microelectronic element includes a package element. The package element further includes a dielectric element having a bottom face and a top face remote from the bottom face and first and second bond windows extending between the top and bottom faces. A plurality of chip contacts may be disposed at the top face adjacent to the first and second bond windows. Additionally, first and second sets of package contacts exposed at diagonally opposite corner regions of the top face, the first and second sets may be conductively connected to the chip contacts. The third and fourth sets of package contacts may be exposed at diagonally opposite corner regions of the top face, but are not conductively connected to the chip contacts. A microelectronic element is positioned adjacent to the bottom face and bond wires extend through the first and second bond windows to conductively connect the microelectronic element to the chip contacts. The first packaged microelectronic element may be rotated relative to the second packaged microelectronic element such that the first and second sets of package contacts of the first packaged microelectronic element may be aligned and interconnected with the third and fourth sets of package contacts of the second packaged microelectronic element.

In another aspect of this embodiment, each of the first and second package elements includes recesses disposed at opposite edges of the dielectric element, wherein the recesses of the first package element may be aligned with the first and second bond windows of the second package element.

In a third embodiment, a package element includes a dielectric element having a bottom face and a top face remote from the bottom face and first and second bond windows extending between the top and bottom faces. First and second chip contacts may be disposed at the top face adjacent to the first and second bond windows, respectively. First and second sets of package contacts may be exposed at diagonally opposite corner regions of the top face, the first set conductively connected to the first chip contacts but not the second chip contacts and the second set conductively connected to the second chip contacts but not the first chip contacts.

In another aspect of this embodiment, the first and second sets of package contacts may be exposed at first and second diagonally opposite corner regions. The package element may further include third and fourth sets of package contacts exposed at the third and fourth diagonally opposite corner regions of the top face. However, the third and fourth sets are not conductively connected to the chip contacts.

In a fourth embodiment, a package element includes a dielectric element that has a bottom face, a top face remote from the bottom face, and a bond window extending between the top and bottom faces. Chip contacts may also be disposed at the top face adjacent to the bond window, respectively. First and second package contacts may be exposed at first and second opposite end regions of the top face. The first set may be conductively connected to the chip contacts, but the second set is not conductively connected to the chip contacts.

In an aspect of this embodiment, the bond window may be disposed between the first and second opposite end regions.

In still another aspect of this embodiment, there may also be a microelectronic element having contacts conductively connected to the chip contacts.

In a fifth embodiment, a stacked microelectronic assembly includes a first packaged microelectronic element stacked and electrically interconnected with a second packaged microelectronic element. Each of the first and second packaged microelectronic elements includes a package element. The package element further includes a dielectric element having a bottom face and a top face remote from the bottom face and a bond window extending between the top and bottom faces. A plurality of chip contacts may be disposed at the top face adjacent to the bond window. First package contacts may also be exposed at a corner region of the top face. The first package contacts may be conductively connected to the chip contacts. Second package contacts may also be exposed at a corner region of the top face opposite from the first package contacts, but the second package contacts are not conductively connected to the chip contacts. A microelectronic element may also be adjacent to the bottom face and bond wires may extend through the bond window to conductively connect the microelectronic element to the chip contacts. The first packaged microelectronic element is rotated relative to the second packaged microelectronic element such that the first package contacts of the first packaged microelectronic element may be aligned with and interconnected with the second package contacts of the second packaged microelectronic element.

In another aspect of this embodiment, each of the first and second package elements may include a recess disposed at an edge of the dielectric element, wherein the recess of the first package element is aligned with the bond window of the second package element.

These and other embodiments of the present invention will be described in more detail below.

DETAILED DESCRIPTION

Figure 2:
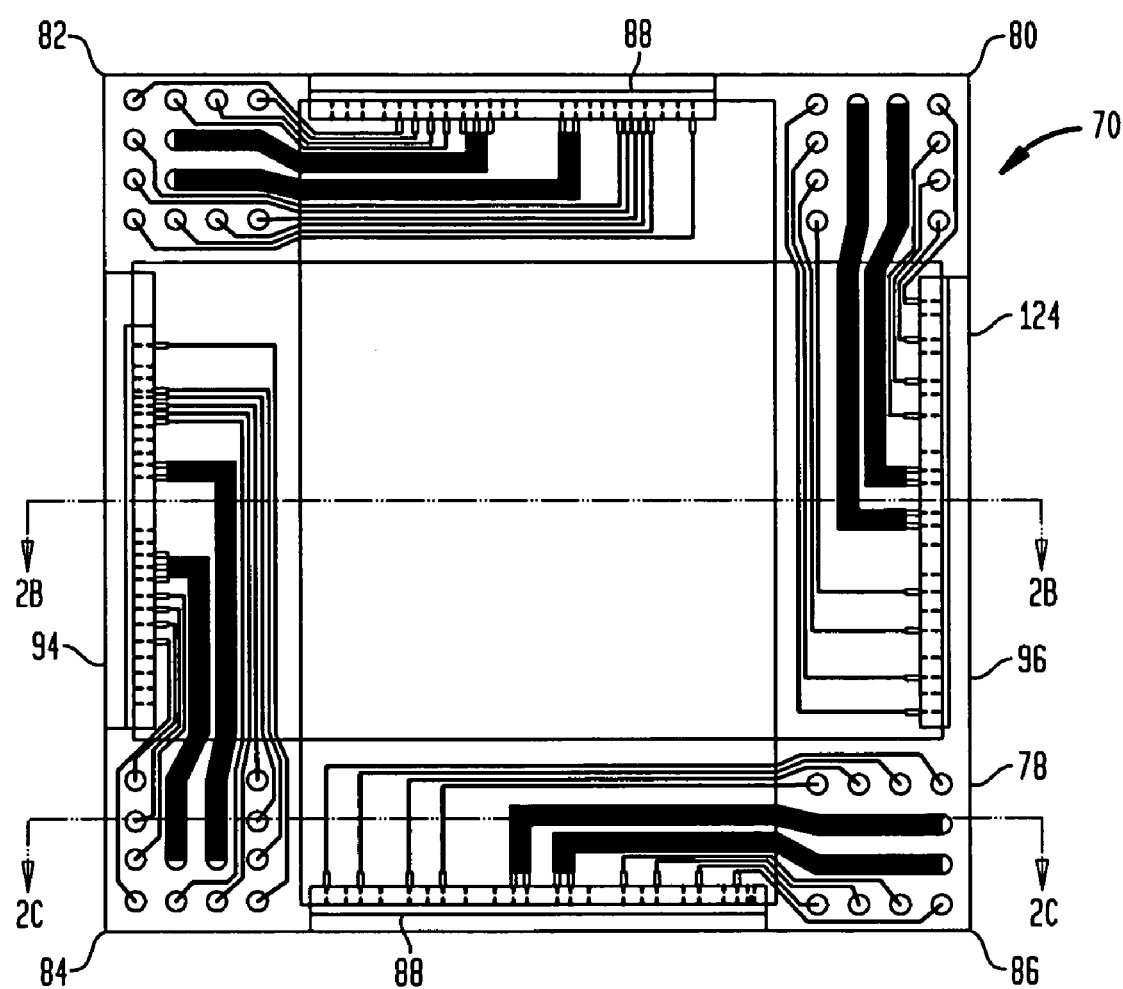
FIG. 2 is a top plan view of a dual layer package in accordance with a preferred embodiment of the present invention.

Referring to FIG. 2, a top plan view of a stacked microelectronic assembly or dual layer package in accordance with a preferred embodiment of the present invention is shown. As will be described in greater detail herein, the dual layer package 70 includes a first single layer package and a second single layer package that is rotated and then stacked on top of the first single layer package.

Figure 1:
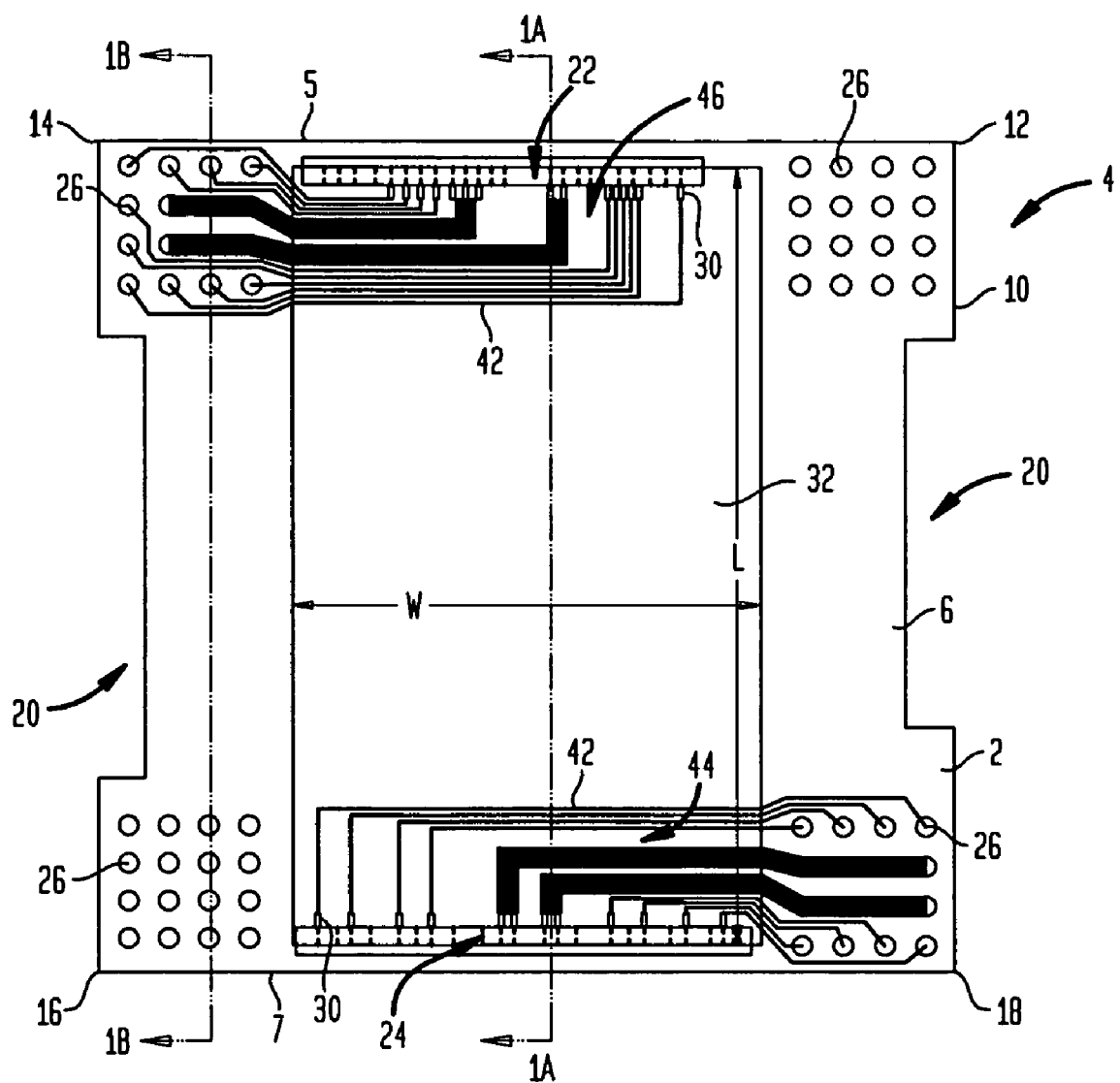
FIG. 1 is a top plan view of a single layer package in accordance with a preferred embodiment of the present invention.

Referring to FIG. 1, a preferred single layer package 4 in plan view is shown. The single layer package 4 preferably includes a dielectric element 2 having a top surface 6 and bottom surface 8. (See FIG. 1A.) The dielectric element 2 may be a single layer, or may be a laminate including several sublayers. The dielectric element 2 desirably is formed primarily from a polymeric material such as polyimide, BT resin, epoxy or other dielectric polymers, and may include reinforcing fibers as for example, glass fibers.

In the embodiment shown in FIG. 1, the dielectric element 2, which is preferably in the general shape of a square and has an outer edge 10 defining its outer perimeter. The dielectric element 2 has first, second, third, and fourth corner regions 12, 14, 16, 18. It is to be understood that although the dielectric element 2 is depicted as having regions wherein the edges of the microelectronic element form the shape of a corner, the application is not limited to regions wherein the edges of the dielectric element meet at 90 degree angles. Rather regions of different shapes, such as rounded regions are contemplated by the scope of the present invention.

Recesses 20 are located between the second and third corner regions 14, 16, as well as the first and fourth corner regions 12, 18. As will be discussed in more detail herein, the recesses 20 can provide access to additional stacked packages.

First and second openings or windows 22, 24 are located on the dielectric element 2 adjacent the upper and lower edges 5, 7 of the dielectric element 2. A plurality of package contacts 26 (solder balls 25 and solder ball pads 27 (FIG. 1B) are preferably exposed at each of the four corner regions 12, 14, 16, 18. Vias 28 (see FIG. 1B) extending from the top surface 6 to the bottom surface 8 of the dielectric element 2 allow for a connection to be made between the package contacts 26 on the top surface 6, including solder balls 25 or the like (see FIG. 1B). Additionally, chip contacts 30 are located adjacent the first and second windows 22, 24.

A microelectronic element 32 is disposed below the dielectric element 32. The microelectronic element may include a semiconductor chip, interposer, circuit panel, module, integrated passives on chip (IPOC) or a combination thereof or various other passive or active element or combination thereof. The microelectronic element 32 preferably does not extend beyond the outer edge 10 of the dielectric element 2. Although not required, the microelectronic element 32 may have a width W and a length L which is twice as large as the width W. For ease of illustration, FIG. 1 is arranged along a coordinate system wherein the length L is aligned in a direction along a Y-axis and the width W is aligned in a direction along an X-axis, perpendicular to the Y-axis. The coordinate system described herein is only used for ease of illustration and does not refer to any gravitational positioning. Descriptive words such as "top," "bottom," "upper," and "lower" are similarly used only for illustration purposes.

Figure 1A:
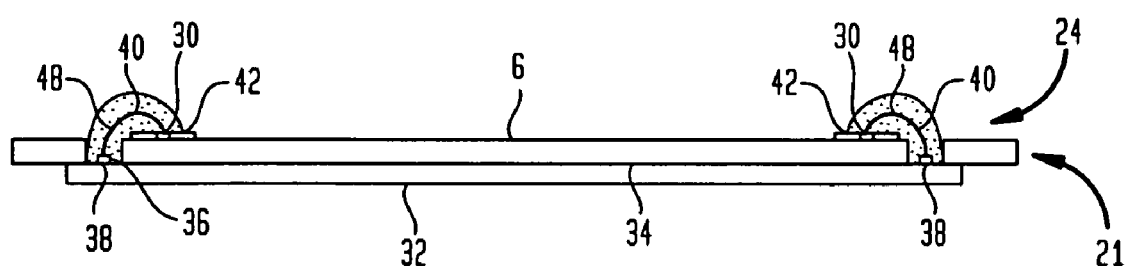
FIG. 1A is a sectional view taken along 1A-1A of FIG. 1.

As best shown in FIG. 1A, a layer of die attach 34 secures the active surface 36 of the microelectronic element 32 to the bottom surface 8 of the dielectric element 2. The dielectric element 2 is positioned over the microelectronic element 32 so that the windows 22, 24 are aligned with bond pads 38 exposed at opposed ends of the active surface 36 of the microelectronic element 32. Wire bonds 40 extend from the bond pads 38 on the microelectronic element 32, through the first and second windows 22, 24 and across the respective edges of the windows in the dielectric element 2 to chip contacts 30 exposed at the top surface 6 of the dielectric element 2. An encapsulant 48 may be deposited over the wire bonds 40 using known conventional methods to secure the wire bonds 40 in place. The encapsulant 48 may be a non-conductive, dielectric material, preferably a polymer which can be either thermoset or thermoplastic materials. The encapsulant 48 can be a compliant or rigid material as desired. Encapsulant material suitable for use as encapsulant 48 are well known in the semiconductor processing art.

Referring back to FIG. 1, the chip contacts 30 closest to the lower edge 7 of the dielectric element 2 are connected to package contacts 26 on the fourth corner region 18 of the dielectric element 2 by traces 42 which extend across the bottom portion of the dielectric element 2. Notably, each of the chip contacts 30 are only connected to package contacts 26 on the fourth corner region 18; none of the traces 42 are connected to package contacts 26 in the first or third corner regions 12, 14. Similarly, the chip contacts 30 closest to the upper edges of the dielectric element 2 are connected to package contacts 26 on the second corner region 14 of the dielectric element 2 by traces 42 which extend across the upper portion 46 of the dielectric element 2. As with respect to the chip contacts 30 closest to the bottom edge 7 of the dielectric element 2, each of the package contacts 26 at the upper portion 46 are only connected to package contacts 26 on the second corner region 14; none of the traces 42 are connected to package contacts 26 in the first or third corner regions 12, 16. In this arrangement, only two of the four sets of package contacts 26 on the dielectric element 2 are connected to the microelectronic element 32. In other words, diagonally opposite corner regions 14 and 18 are utilized by the microelectronic element 32. None of the chip contacts are connected to the package contacts on the remaining and also diagonally opposite first and third corner regions 12, 16.

Figure 1B:
FIG. 1B is a sectional view taken along line 1B-1B of FIG. 1.

As shown in FIG. 1B, once completed, solder balls 25 or the like can be used to stack the package. Vias 28 extending between the top and bottom surfaces 6, 8 of the dielectric element 2 provide a connection between the solder balls 25 and the solder pads 27.

Figure 2A:
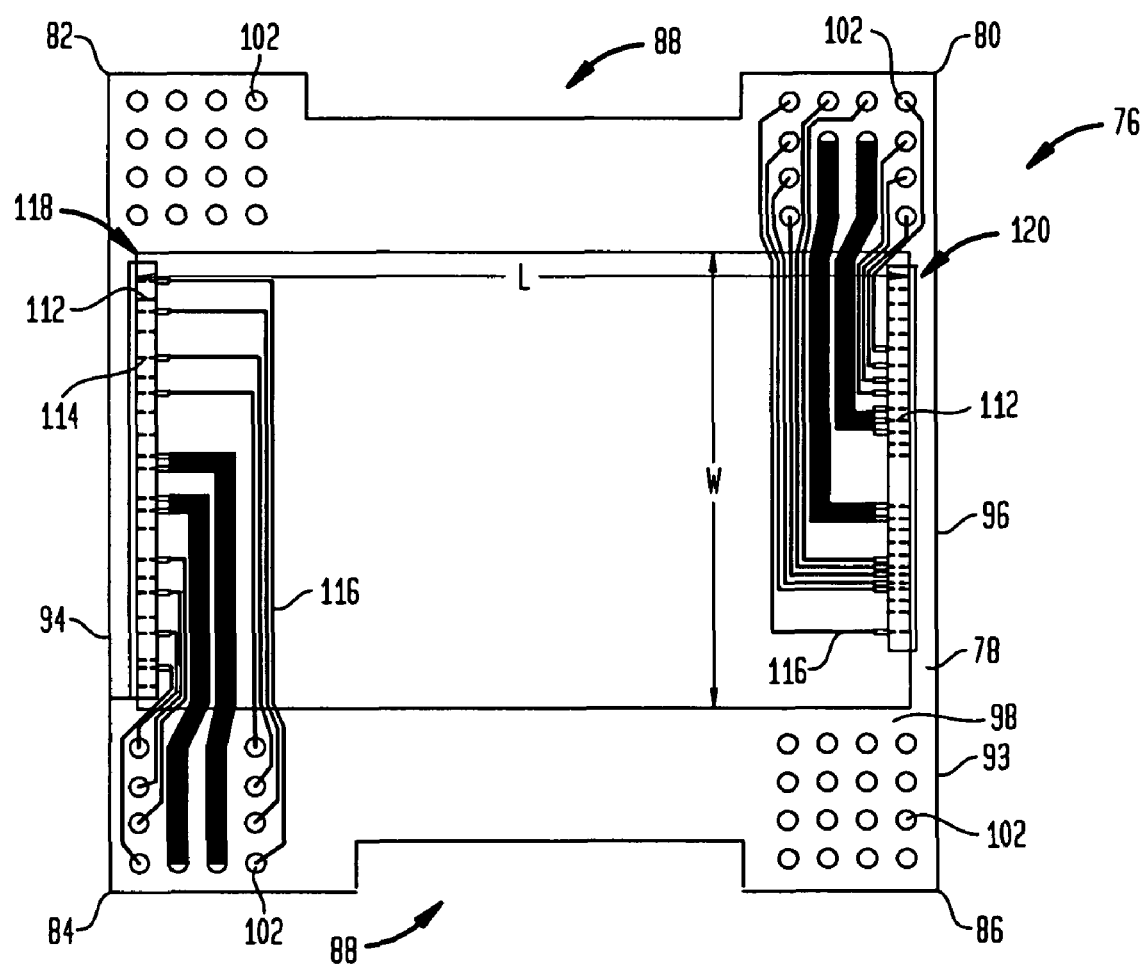
FIG. 2A is a top plan view of a rotated single layer package in accordance with a preferred embodiment of the present invention.

Referring to FIG. 2, a top plan view of a dual layer package 70 in accordance with a preferred embodiment of the present invention is shown. The dual layer package 70 may be comprised of a first single layer package and a similar second single layer package that are stacked one on top of the another. As best shown in FIG. 2A, the lower first package 74 is in the same orientation as the single layer package 4 shown in FIGS. 1-1A and for ease of discussion, the lower first package 74 will be treated as the single layer package 4. The upper second package 76 is preferably rotated 90 degrees to the lower first package 74.

Figure 2B:
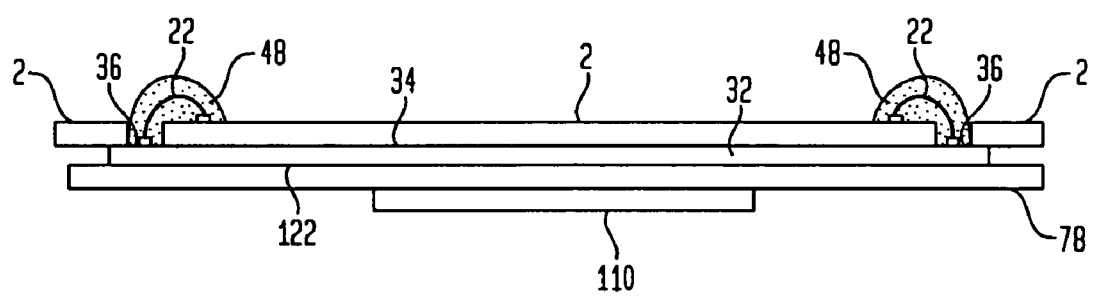
FIG. 2B is a sectional view taken along line 2B-2B of FIG. 2.
Figure 2C:
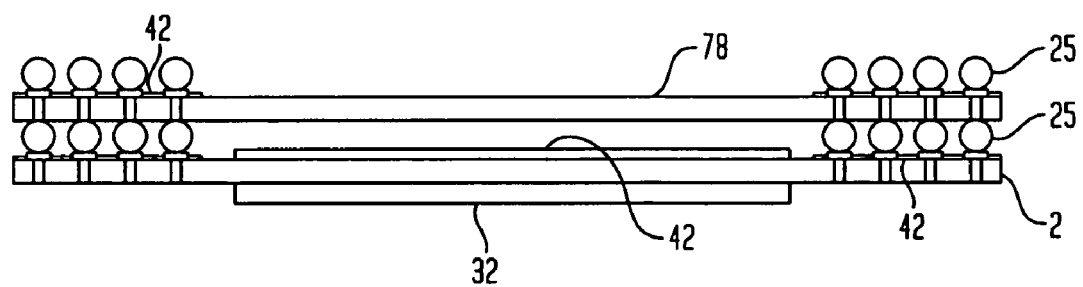
FIG. 2C is a sectional view taken along line 2C-2C of FIG. 2.

Referring to FIG. 2A, the rotated upper second package 76 is shown. The second package comprises a second microelectronic element disposed below a dielectric element also having windows and recesses. The rotated upper second package 76 includes a dielectric element 78 which has first, second, third, and fourth corner regions 80, 82, 84, 86 that are aligned with the first, second, third, and fourth corner regions 12, 14, 16, 18 of the lower first package 74. Recesses 88 on the second package 76 are located between the first and second corner regions 80, 82, as well as between the third and fourth corner regions 84, 86. First and second openings or windows 90, 92 are located on the dielectric element 78 adjacent the left and right edges 94, 96 of the dielectric element. A plurality of package contacts 102 are preferably exposed at each of the four corner regions 80, 82, 84, 86. Vias 106 (see FIG. 2B) extending from the top surface 98 to the bottom surface 100 of the dielectric element 78 allow for a connection to be made between the package contacts 102 on the top surface 98 and solder balls 108 (see FIG. 2B) or the like on the bottom surface 100. Additionally, chip contacts 104 are located adjacent the first and second windows 90, 92.

As in the lower first package 74, a microelectronic element 110 is disposed below the dielectric element 78 of the second package 76. The microelectronic element 110 preferably does not extend beyond the outer edge 93 of the dielectric element 78. Although not required, the microelectronic 110 may have a width W and a length L which is twice as large as the width W. For ease of illustration, FIG. 2A is arranged along a coordinate system wherein the length L is aligned in a direction along an X-axis and the width W is aligned in a direction along a Y-axis, perpendicular to the Y-axis.

The dielectric element 78 of the second package 76 is positioned over the microelectronic element 110 so that the first and second windows 90, 92 are aligned with bond pads 112 exposed at opposed ends of the active surface of the microelectronic element 110. Bonds wires 114 extend from the bond pads 112 on the microelectronic element 110, through the first and second windows 90, 92 to chip contacts 104 exposed at the top surface 98 of the dielectric element 78.

The chip contacts 104 closest to the left edge 94 of the dielectric element 78 are connected to package contacts 102 on the third corner region 83 of the dielectric element 78 by traces 116 which extend down the left side 118 of the dielectric element 78. Each of the chip contacts 104 along the left side 118 are connected to package contacts 102 on the third corner region 84; none of the traces 116 on the left side 118 are connected to package contacts 102 in the second or fourth corner region 80, 84. On the right side 120, each of the chip contacts 104 closest to the right edge 96 of the dielectric element 78 of the second package 76 are connected to package contacts 102 on the first corner region 80 of the dielectric element 78 by traces 116 which extend along and up the right side 120 and top surface 98 of the dielectric element 78. As with respect to the chip contacts 104 closest to the left edge 94 of the dielectric element 78, each of the chip contacts 104 on the right side 120 are only connected to package contacts on the first corner region 80; none of the traces 116 are connected to package contacts 102 in the second or fourth corner regions 80, 84. In this arrangement, only two of the four sets of package contacts 102 on the dielectric element 78 are connected to the microelectronic element 110. In other words, none of the chip contacts 104 are connected to the package contacts 102 on the first and third corner regions 80, 84.

Referring back to FIGS. 2 and 2B, FIG. 2B illustrates a sectional view of the first and second packages 74, 76 stacked together. Although not required, a layer of adhesive 122 can be used to attach the passive surface of the microelectronic element 110 of the second package to the bottom surface of the dielectric element 78 of the second package 76. The length L of the microelectronic element of the second package 76 is preferably perpendicular to the length L of the first microelectronic element 32. (FIGS. 1, 2.)

As best seen in FIG. 2, when stacked together, the corner regions of the first and second packages 74, 76 are preferably aligned. In this plan view, the top surface 98 of the dielectric element 78 is exposed, such that the first, second, third, and fourth corner regions 80, 82, 84, 86 are visible. For ease of discussion, the four corner regions of the dual layer package 70 will also be referred to as first, second, third, fourth corner regions 80, 82, 84, 86.

The recesses 88 on the dielectric element 78 of the second package 76 expose the encapsulated wire bonds 40 extending from bond pads 38 on the microelectronic element 32 of the first package 74 to the chip contacts on the dielectric element of the first package 74. Additionally, a portion of the upper and lower edges 5, 7 of the dielectric element 2 of the first package 74 are also exposed through the recesses 88. This provides for an outer edge 124 of the dual layer package 70 to form a perimeter in the form a complete square.

Only one set of package contacts 26, 102 at each of the four corner regions 80, 82, 84, 86 of the dual layer package 70 have traces 42, 116 connected thereto. The first and third corner regions 80, 84 of the dual layer package 70 (and second package 76) have traces 116 connected thereto. The second and fourth corner regions 82, 86 of the dual layer package 70 (and first package 74) have traces 42 connected thereto. This arrangement results in a dual layer package 70 wherein each set of the traces 42, 116 extending from the chip contacts 30, 104 does not extend to more than one corner region of the dual layer package 70. Additionally, even though the package contacts 26, 102 on each of the first and second package elements 74, 76 may preferably be aligned with one another, the package contacts 26 having traces 42 connected thereto on the first package 74 are not aligned with package contacts 102 on the second package 76 having traces 116 connected thereto and vice versa.

Figure 3:
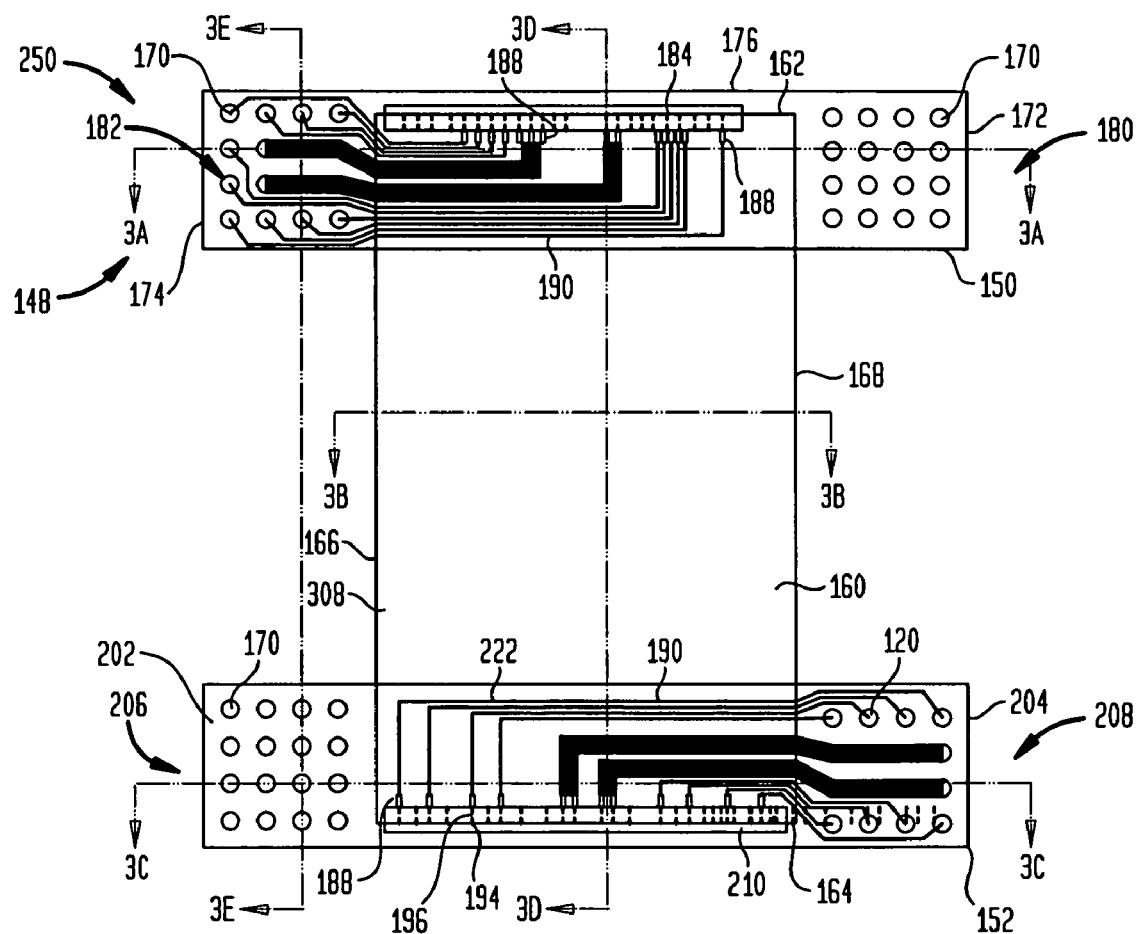
FIG. 3 is a top plan view of a single layer package in accordance with an alternative embodiment of the present invention.

Referring to FIG. 3, an alternative embodiment in accordance with the present invention is shown. As an alternative to a single dielectric element supporting a single microelectronic element, two strips of dielectric elements may be attached to the opposed ends of a microelectronic element. As shown, first and second dielectric elements 150, 152 are disposed above the opposed upper and lower edges 162, 164 of the microelectronic element 160. Although not required, the first and second dielectric element 150, 152 are preferably in the form of a longitudinal strips extending beyond both the left and right edges 166, 168 of the microelectronic element 160, as well as the respective upper and lower edges 162, 164 of the microelectronic element 160. Package elements 170 are disposed at opposed right and left ends 172, 174 of the first dielectric element 150, which is also the upper right and upper left ends 180, 182 of the single layer package 148. A window 184 is adjacent the upper edge 176 of the first dielectric element 150 and chip contacts 188 are adjacent the window 184. Traces 190 extend from each of the chip contacts 188 to the package contacts located on the left end 174 of the first dielectric element 150 of the single layer package 148.

Figure 3A:
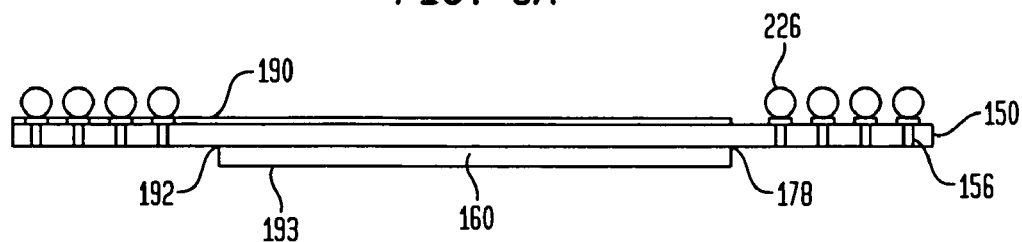
FIG. 3A is a sectional view taken along line 3A-3A of FIG. 3.

As shown, the first dielectric element 150 is disposed above the microelectronic element 160. Referring to FIG. 3A, although not required, a layer of die attach (not shown) may be used to attach the bottom surface 178 of the first dielectric element 150 to the active surface 192 of the microelectronic element 160. As in the previous embodiment, wire bonds 194 connect bond pads 196 exposed at the active surface 192 of the microelectronic element 160 to chip contacts 188 located on the top surface 177 of the first dielectric element 150 of the single layer package 148. Traces 190 then extend from the chip contacts 188 to the package contacts 170 on the left end 174 of the first dielectric element 150 of the single layer package 148, such that there are no traces 190 extending to the package contacts 170 on the right end 172 of the first dielectric element 150. Vias 156 also extend from the top surface 177 to the bottom surface 178 of the first dielectric element.

Figure 3B:
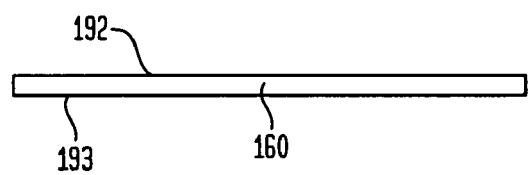
FIG. 3B is a sectional view taken along line 3B-3B of FIG. 3.
Figure 3C:
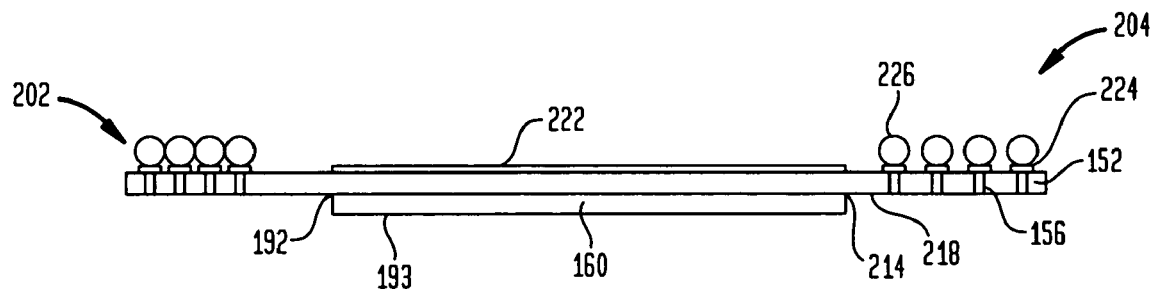
FIG. 3C is a sectional view taken along line 3C-3C of FIG. 3.

Referring to FIGS. 3 and 3C, a second dielectric element 152 of the single layer package 148 is disposed above the lower edge 164 of the microelectronic element 160. The second dielectric element 152 is preferably similar to the first dielectric element 150. Package contacts 170 are located on the left and right ends of the second dielectric element 152, or the lower left and lower right ends 206, 208 of the single layer package 148. A window 210 is disposed adjacent the bottom edge 164 of the microelectronic element 160, along with chip contacts 212.

A layer of die attach 214 (see FIG. 3C) may be used to attach the active surface 192 of the microelectronic element 160 to the bottom surface 218 of the second dielectric element 152. The window 210 in the second dielectric element 152 is aligned with bond pads 196 on the active surface 192 of the microelectronic element 160, so as to permit bond wires 194 to connect the bond pads 196 to the chip contacts 212 on the top surface 220 of the second dielectric element 152. Bond wires 194 therefore loop over the edge of the window 210 in the second dielectric element element 152. Vias 156 (see FIG. 3C) also extend from the top surface to the bottom surface of the second dielectric element.

Traces 222 connect the chip contacts 212 to the package contacts 224 on the right end 204 of the second dielectric element 152, but there are no traces extending from the chip contacts 212 to the package contacts 224 on the left edge 202 of the second dielectric element.

Figure 3D:
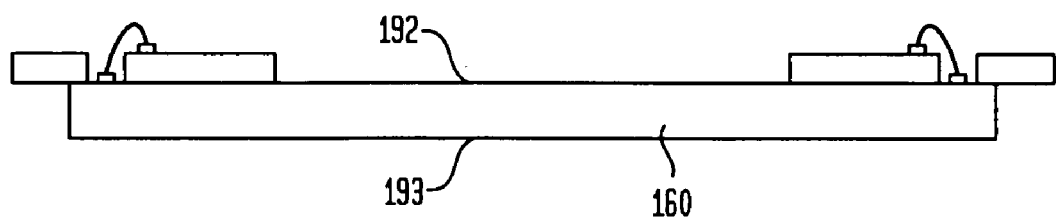
FIG. 3D is a sectional view taken along line 3D-3D of FIG. 3.
Figure 3E:
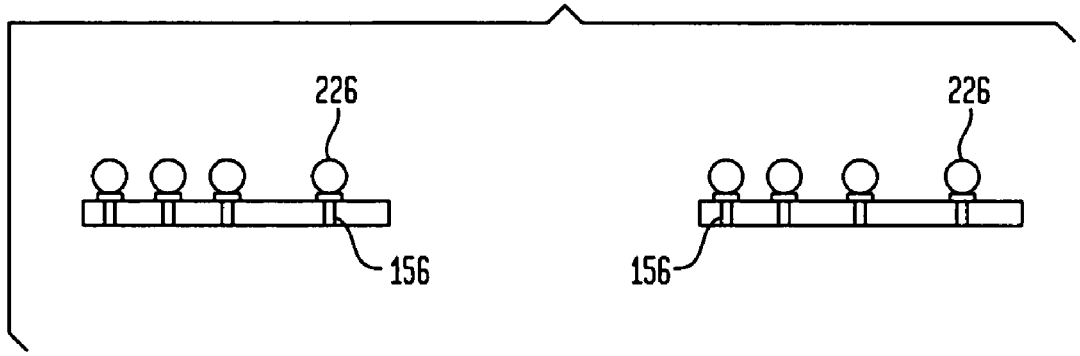
FIG. 3E is a sectional view taken along line 3E-3E of FIG. 3.
Figure 3F:
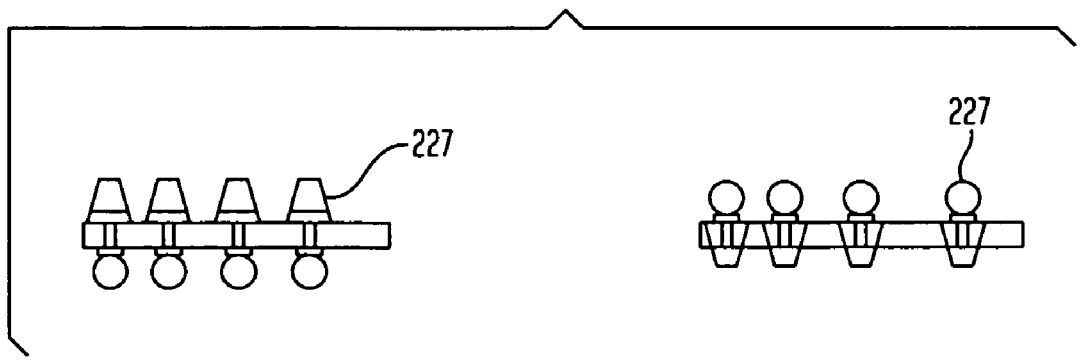
FIG. 3F is an alternative embodiment in accordance with the present invention.

Referring to FIGS. 3B, 3D, and 3E, the first and second dielectric elements are preferably not connected together, so that a substantial portion of both active and passive surfaces 192, 193 of the microelectronic element 160 are exposed. As also shown in FIG. 3F, as an alternative to the use of solder balls 226, micropillars 227, pins, or vertical conductive structures may be used instead of solder balls 226.

Figure 4:
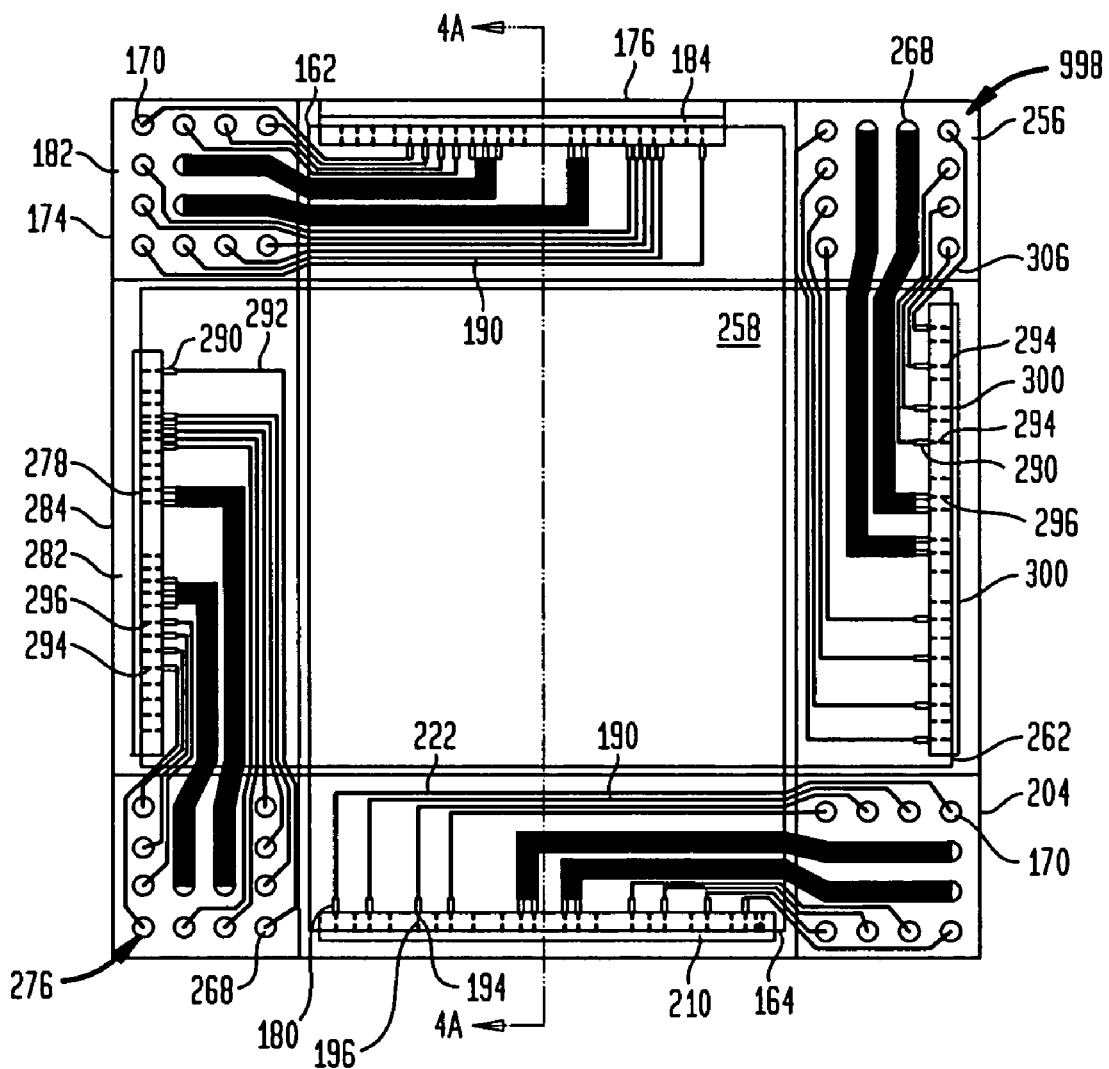
FIG. 4 is a top plan view of a dual layer package in accordance with an alternative embodiment of the present invention.
Figure 4A:
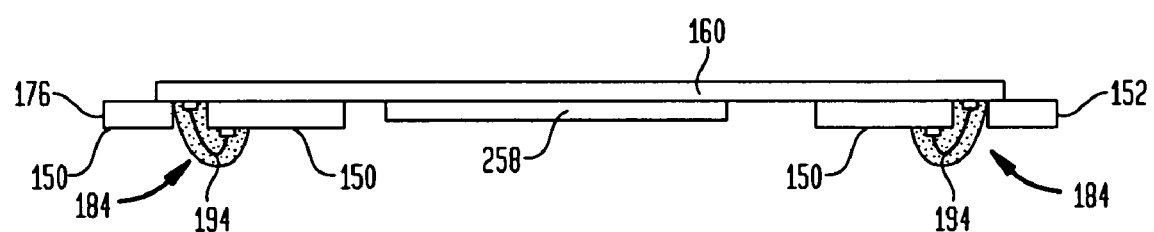
FIG. 4A is a sectional view taken along line 4A-4A of FIG. 4.

Referring to FIGS. 4 and 4A, a dual layer package 146 including two single layer packages having first and second dielectric elements is shown. The first lower package 250 (FIG. 3) is the same as the single layer package shown in FIG. 3 and for purposes of discussion, will be treated as the first lower package 250. The first lower package 250 therefore has a microelectronic element having a length L oriented on the Y-axis, and a width W oriented on the X-axis.

Figure 4B:
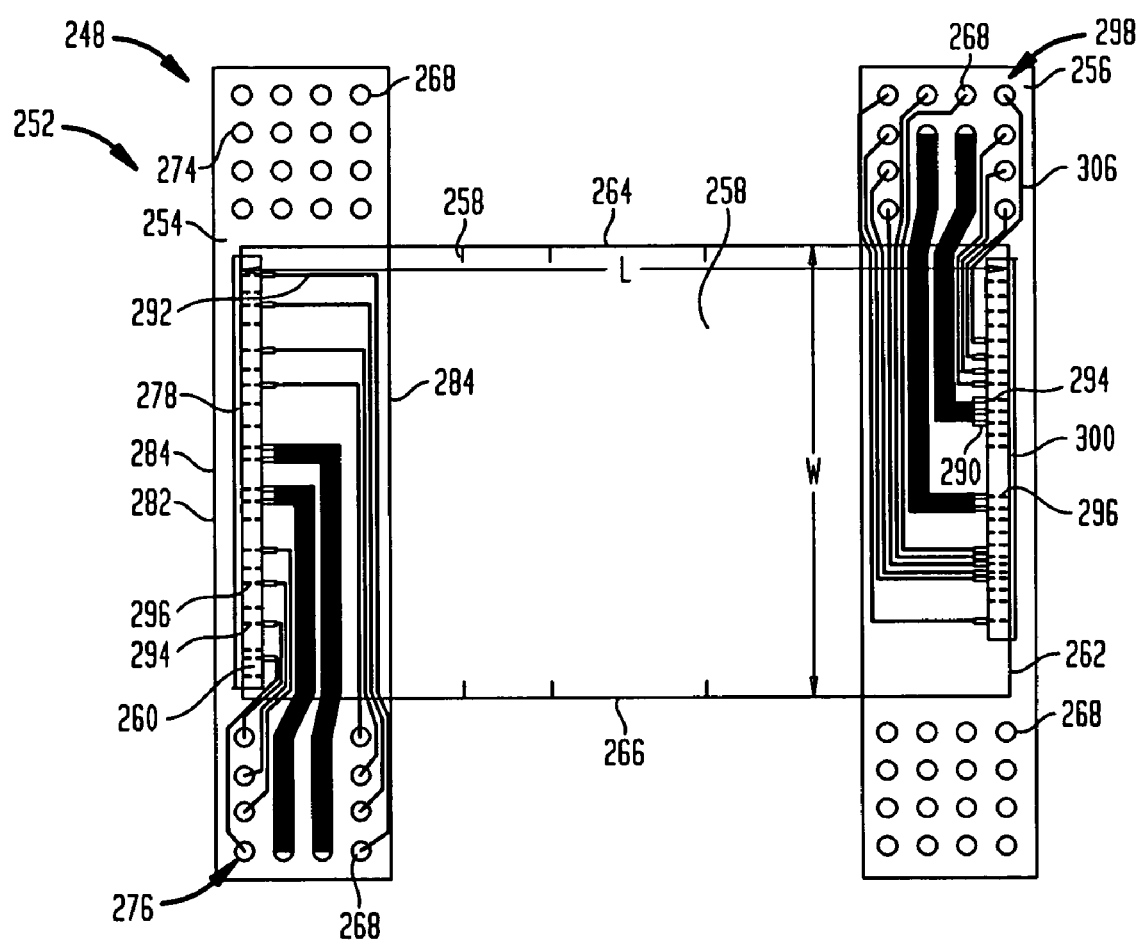
FIG. 4B is a top plan view of a rotated single layer package in accordance with an alternative embodiment of the present invention.

The upper second package is shown in FIG. 4B and has been rotated 90 degrees. In this orientation, the first and second dielectric elements 254, 256 are attached to the opposed ends of microelectronic element 258. As shown, first and second dielectric elements 254, 256 are disposed above the left and right edges 260, 262 of the second microelectronic element 258. Although not required, each of the first and second dielectric elements 254, 256 are preferably in the form of a longitudinal strip extending beyond both the left and right edges 260, 262 of the microelectronic element, as well as the respective upper and lower edges 264, 266 of the microelectronic element 258. Package contacts 268 are disposed at opposed top and bottom ends of the first dielectric element 250, which is also the upper left end 274 and lower left ends 276 of the second single layer package 248. A window 278 is adjacent the left edge 284 of the first dielectric element 254 and extends along a portion of the length of the first dielectric element layer and chip contacts 290 are adjacent the window 278. Traces 292 extend from each of the chip contacts 290 to the package contacts 268 located on the lower left end 276 of the first dielectric element 254.

Bond wires 294 connect bond pads 296 exposed at the active surface of the microelectronic element 258 to chip contacts 290 located on the top surface of the first dielectric element 254 of the second single layer package 248. Traces 292 then extend from the chip contacts 290 to the package contacts 268 on the left end 276 of the first dielectric element 254 of the second single layer package 248, such that there are no traces 292 extending to the package contacts 268 on the lower left end 276 of the first dielectric element 254. If desired, an encapsulant 295 may be deposited over the wire bonds.

A second dielectric element 256 of the second single layer package 248 is also disposed above the right edge 262 of the microelectronic element 258. The second dielectric element 256 is preferably similar to the first dielectric element. Package contacts 268 are located on the upper right end 248 of the second dielectric element 256. A window 300 is disposed adjacent the right edge 262 of the second microelectronic element 258, and chip contacts 290 are adjacent the window 300.

The window 300 in the second dielectric element 256 is aligned with bond pads 302 on the active surface of the microelectronic element 258, so as to permit bonds wires 294 to connect the bond pads 302 to the chip contacts 290 on the top surface 304 of the second dielectric element 256. Bond wires 294 therefore loop over the edge of the window 300.

Traces 306 connect the chip contacts 290 to the package contacts 268 on the upper right end 298 of the second dielectric element 256, but there are no traces 306 extending from the chip contacts 290 to the package contacts 268 on the lower right end 299 of the second dielectric element 256.

Unlike the first single layer package, when rotated, the length L of the microelectronic element 258 of the second single layer package 248 is oriented along the X-axis, whereas the width W is oriented along the Y-axis. The length L is therefore preferably twice as long as the width W.

Referring back to FIG. 4, a top plan view of the dual layer package 146 is shown. The rotated second package 248 (see also FIG. 4B) fits within the space 308 (see also FIG. 3) between the first and second dielectric elements 150,152 of the first package 250 (see also FIG. 3). In this arrangement the active face of the first package 250 is disposed below the passive face of the microelectronic element 258 of the second package 252. The top of the entire second package 252 remains exposed.

The upper right end 298 and lower right end 299 of the second dielectric element 256 of the second package 252 overlaps the corresponding upper right end 180 of the first dielectric element 150 of the first package, as well as the lower right end 208 of the second dielectric element 152 of the first package 250. Similarly, the upper left and lower left ends 274, 276 of the first dielectric element 254 of the second package 252 overlaps the corresponding upper left end 182 of the first dielectric element 150 of the first package 250, as well as the lower left end 206. As each of these ends are aligned, the dual layer package 146 has four corner regions: an upper right first corner region 310, a left upper second corner region 312, a lower left third corner region 314, and a lower right fourth corner region 316.

Each of the respective corner regions of the second package 252 therefore overlaps the corresponding corner regions of the first package 248. This provides for the package contacts 268 of first and second dielectric elements 254, 256 of the second package 252 to overlap and be aligned with the corresponding package contacts 252 on the upper right and left ends and lower right and left ends of the first package 250.

In the stacked position, traces on the second package extending in the longitudinal direction along the Y-axis are exposed, as well as a portion of the traces on the first package running in the horizontal direction along the X-axis on the first package. Unlike the previous embodiment shown in FIGS. 1-2, wherein a substrate spanned the entire length of the microelectronic element, the opening 308 between the first and second dielectric elements of the second package 252 allows for a portion of the traces on the first package to be exposed.

Package contacts 170 connected to the horizontal traces 190 on the first package 250 are hidden from view by the upper left and lower right ends of the respective first and second dielectric elements 254, 256 of the second package 252 which support the package contacts 268.

Due to the elimination of the dielectric element between the first and second dielectric elements of the first and second packages, as well as the rotation of the second package over the first package, the microelectronic elements of the first and second packages are directly adjacent one another. This provides for a relatively thin stacked package.

Figure 5:
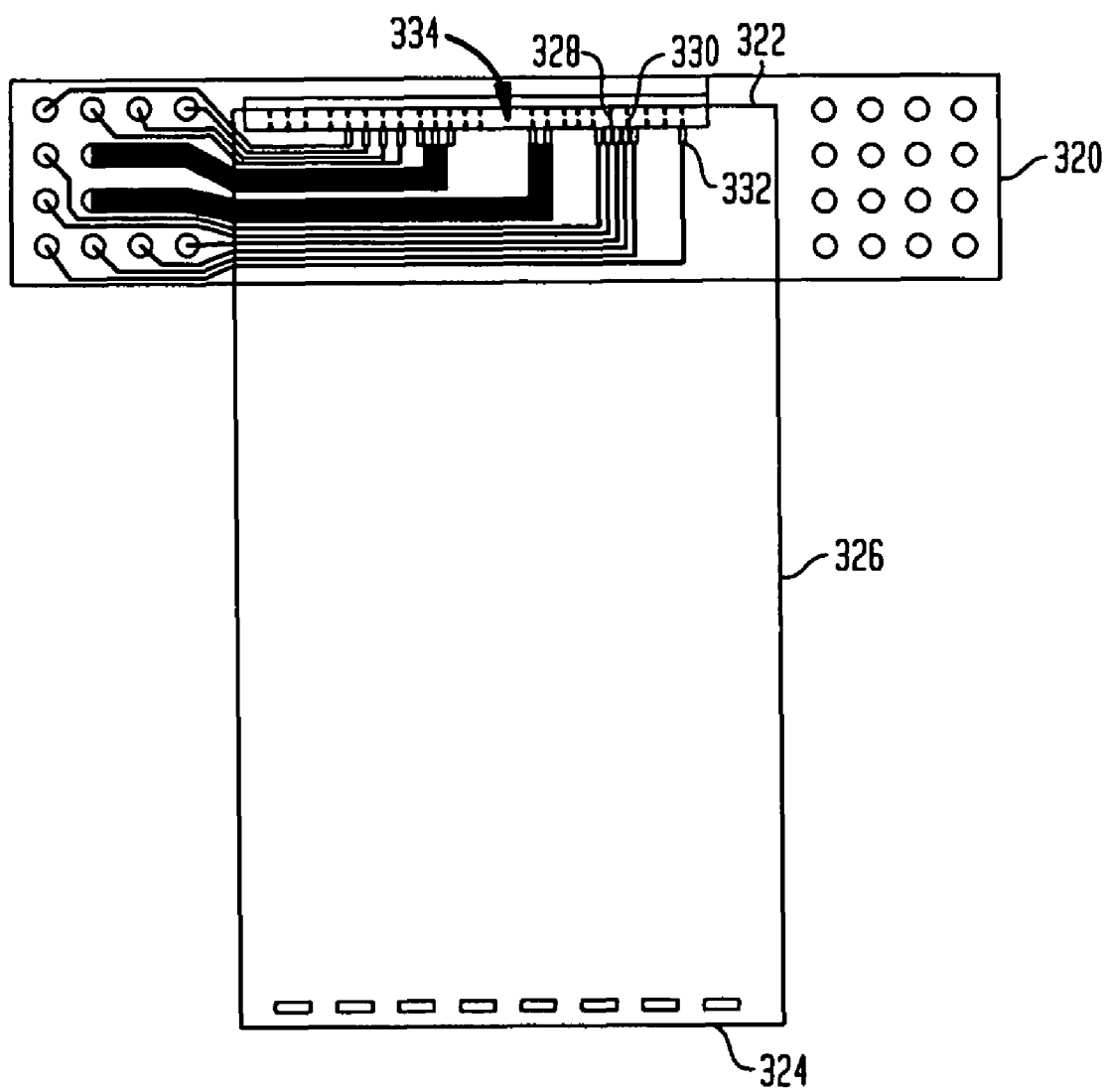
FIG. 5 is an alternative embodiment of a single layer package in accordance with the present invention.

It is to be understood that although it is a preferred alternative embodiment to use two longitudinal strips of dielectric elements to support a single microelectronic element, one dielectric element at only one end of the microelectronic element is also contemplated by the present invention. As shown in FIG. 5, an alternative single layer package 319 is shown. The single layer package is identical to the embodiments in FIG. 3, except that only one dielectric element 320 is utilized. A microelectronic element 326 having first and second ends 322, 324 is disposed below the dielectric element 320. As in the previous embodiments, bond wires 328 extend from bond pads 330 on the microelectronic element 326, through a window 334 in the dielectric layer 320, to chip contacts 332 on the top surface 336 of the dielectric layer 320.

The second end 324 of the microelectronic element 326, is not disposed below a dielectric element, such that bond pads 330 remain exposed at the top surface 336 of the microelectronic element 326.

Figure 6:
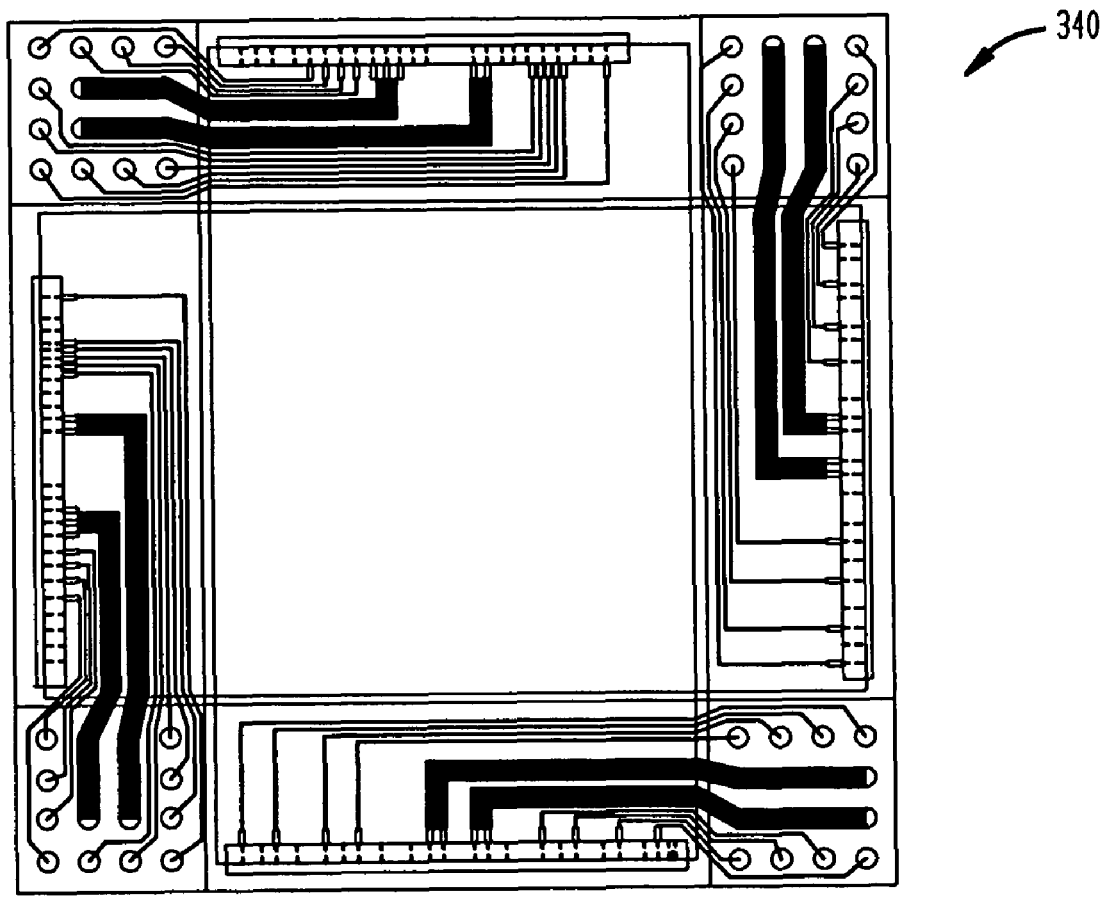
FIG. 6 is a top plan view of a stacked package in accordance with another embodiment of the present invention.

Referring to FIG. 6, an alternative stacked package 340 is shown. In this embodiment, four single layer packages, such as shown in FIG. 5, are stacked together. However, it should be appreciated that as few as two single layer packages, or more than four single layer packages may be stacked together in various arrangements.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised. The following claims describe various embodiments of the invention.

The invention claimed is:

1. A packaged microelectronic element, comprising:
a package element, said package element including:
a dielectric element having a bottom face and a top face remote from said bottom face and first and second bond windows extending between said top and bottom faces;
a plurality of chip contacts disposed at said top face adjacent to said first and second bond windows;
first and second sets of package contacts exposed at diagonally opposite corner regions of said top face, said first and second sets conductively connected to said chip contacts;
first and second recesses disposed at opposite edges of said dielectric element;
a microelectronic element adjacent to said bottom face; and
bond wires extending through said first and second bond windows to conductively connect said microelectronic element to said chip contacts.

2. The packaged microelectronic element of claim 1, wherein said first and second bond windows are disposed adjacent to and extend in a direction parallel to first and second opposite edges of said microelectronic element.

3. The packaged microelectronic element of claim 2, wherein said bond wires are connected to bond pads of said microelectronic element and said first and second bond windows are aligned with said bond pads.

4. The packaged microelectronic element of claim 1, wherein said microelectronic element has long edges extending in a longitudinal direction and shorter edges extending in a lateral direction, said shorter edges being shorter than said long edges, wherein said corner regions are adjacent to said long edges.

5. The packaged microelectronic element as discussed in claim 4, further comprising first and second sets of conductive traces extending from said chip contacts along said top face to said first and second sets of package contacts, respectively.

6. The packaged microelectronic element as discussed in claim 5, wherein said chip contacts include first chip contacts adjacent to a first edge of said microelectronic element and second chip contacts adjacent to a second edge of said microelectronic element opposite from said first edge, wherein said first set of traces extend from said first chip contacts to said first package contacts but not said second package contacts and said second set of traces extend from said second chip contacts to said second package contacts but not said first package contacts.

7. The packaged microelectronic element of claim 1, wherein said package contacts include conductive posts extending from pads at said top face.

8. A package element, comprising:
a dielectric element having a bottom face and a top face remote from said bottom face and first and second bond windows extending between said top and bottom faces;
first and second chip contacts disposed at said top face adjacent to said first and second bond windows, respectively;
first and second sets of package contacts exposed at diagonally opposite corner regions of said top face, said first set conductively connected to said first chip contacts but not said second chip contacts and said second set conductively connected to said second chip contacts but not said first chip contacts; and
first and second recesses disposed at opposite edges of said dielectric element.

9. A package element as discussed in claim 8, wherein said first and second sets of package contacts are exposed at first and second diagonally opposite corner regions, said package element further comprising third and fourth sets of package contacts exposed at third and fourth diagonally opposite corner regions of said top face, said third and fourth sets being not conductively connected to said first and second chip contacts.

10. A package element, comprising:
a dielectric element having a bottom face and a top face remote from said bottom face and a bond window extending between said top and bottom faces;
chip contacts disposed at said top face adjacent to said bond window, respectively;
first and second sets of package contacts exposed at first and second opposite end regions of said top face; and
first and second recesses disposed at opposite edges of said dielectric element;
said first set of package contacts being conductively connected to said chip contacts, said second set of package contacts being not conductively connected to said chip contacts.

11. The package element of claim 10 wherein said bond window is disposed between said first and second opposite end regions.

12. An assembly including the package element as discussed in claim 10, further comprising a microelectronic element having contacts conductively connected to said chip contacts.

* * * * *